US012644679B2

(12) United States Patent
Liao

(10) Patent No.: US 12,644,679 B2
(45) Date of Patent: Jun. 2, 2026

(54) ELECTRONIC TARGET WITH MEMS SENSOR

(71) Applicant: GUAY GUAY TRADING CO., LTD., Changhua County (TW)

(72) Inventor: Yin-Hsi Liao, Changhua County (TW)

(73) Assignee: GUAY GUAY TRADING CO., LTD., Changhua County (TW)

( * ) Notice: Subject to any disclaimer, the term of this patent is extended or adjusted under 35 U.S.C. 154(b) by 333 days.

(21) Appl. No.: 18/454,809

(22) Filed: Aug. 24, 2023

(65) Prior Publication Data

US 2025/0067542 A1 Feb. 27, 2025

(51) Int. Cl.
*F41J 5/00* (2006.01)
*B81B 7/00* (2006.01)
*F41J 5/056* (2006.01)
*F41J 5/14* (2006.01)

(52) U.S. Cl.
CPC .............. *F41J 5/056* (2013.01); *B81B 7/007* (2013.01); *F41J 5/14* (2013.01); *B81B 2201/0285* (2013.01)

(58) Field of Classification Search
None
See application file for complete search history.

(56) References Cited

U.S. PATENT DOCUMENTS 2,916,289 A * 12/1959 Zito ............................ F41J 5/06
346/139 R
5,716,302 A * 2/1998 Andersson ............. A63B 69/34
482/84

8,105,087 B2 * 1/2012 Valentini .................. F41J 5/056
434/11
8,523,185 B1 * 9/2013 Gilbreath ................... F41J 5/14
434/23
9,429,397 B1 * 8/2016 Hill ............................ F41J 5/06
11,131,529 B2 * 9/2021 Brockel ...................... F41J 5/14
2003/0091960 A1 * 5/2003 Rosa .......................... F41J 7/04
434/21
2003/0134700 A1 * 7/2003 Salva ........................ F41J 13/02
473/476
2005/0153262 A1 * 7/2005 Kendir .................. F41G 3/2655
434/21
2015/0247709 A1 * 9/2015 Roberts ...................... F41J 5/04
340/540
2016/0370156 A1 * 12/2016 Elizondo .................. F41J 5/056
2019/0168098 A1 * 6/2019 Kinsella ..................... F41J 5/04

* cited by examiner

*Primary Examiner* — Sunit Pandya
(74) *Attorney, Agent, or Firm* — Birch, Stewart, Kolasch & Birch, LLP

(57) ABSTRACT

The electronic target includes a main member having a target base and a front plate, a power element inside the target base, a main control device inside the target base and electrically connected to the power element, a MEMS sensor device behind the front plate and electrically connected to the main control device, and a wireless control device mounted on and electrically connected to the main control device. By leveraging the MEMS sensor device and the power element, the assembly and deployment of the electronic target becomes straightforward and less susceptible to damage. Moreover, the use of wireless communications relieves limitation by the venue and reduces susceptibility to interference. This simplifies the configuration and setup process for interactions between targets, achieving increased variability in shooting modes and enhancing entertainment or training effectiveness.

10 Claims, 13 Drawing Sheets

FIG. 3

ELECTRONIC TARGET WITH MEMS SENSOR

BACKGROUND OF THE INVENTION

(a) Technical Field of the Invention

The present invention is generally related to electronic targets, and more particular to an electronic target utilizing a MEMS (Micro Electro Mechanical Systems) sensor.

(b) Description of the Prior Art

The electronic target is the core of shooting training systems. During combat simulations or survival games, the size of the electronic target can affect its positioning on different-shaped targets. The weight of the electronic target can also influence the types of targets it can be applied to (i.e., fixed or suspended targets). The quality of the electronic target's sensors can impact the accuracy of training results. The durability and power consumption of the electronic target's sensors can affect the setup cost of the system. All of the above issues are closely related to the electronic target's sensors. Among many types of sensors, the most effective in addressing the mentioned issues are MEMS (Micro Electro Mechanical Systems) sensors. Unfortunately, there has been no integration of MEMS sensors into electronic targets.

As the name suggests, the electronic target requires electrical power to operate, resulting in exposed electrical wires. These exposed wires are susceptible to damage from bullets. Moreover, depending on the location and setting of the electronic target, especially in outdoor environments, there may be a need to lay out long electrical wires, which can be quite inconvenient.

Furthermore, depending on the training or gaming modes, there is often a need for communication between different electronic targets. The common approach is to use a server as an intermediary to relay signals between electronic targets via network or Bluetooth connections. However, network signals become weaker in remote areas and are susceptible to obstruction and distance limitations. Moreover, both network and Bluetooth connections are easily susceptible to interference.

Therefore, the aforementioned electronic target faces the following problems and deficiencies that need improvement:

Firstly, using ordinary sensors in conjunction with the electronic target results in heavy weight and large volume, complicating their integration and increasing manufacturing costs.

Secondly, the exposed electrical wires are prone to damage, and due to venue requirements, there is a need to lay out long electrical wires.

Thirdly, communication between electronic targets relies on a server, leading to a loss of responsiveness, and the issues of weak network and Bluetooth signals in remote areas, susceptibility to obstruction, and distance limitations.

SUMMARY OF THE INVENTION

A main objective of the present invention is to integrate MEMS sensor devices into the electronic target, taking advantage of the small size, light weight, low power consumption, durability, affordability, and stable performance of MEMS sensor devices. This integration simplifies the deployment process of the electronic targets and reduces the overall setup cost.

Another major objective of the present invention is to incorporate a wireless control device, enabling the electronic target to have wireless signal transmission and reception capabilities. This enhancement ensures more real-time interaction between targets, using radio waves in the frequency range of 868 MHz to 1 GHz. This communication method allows for stable signal transmission without being limited by distance or geographical factors, providing a consistent and reliable communication quality.

Another major objective of the present invention is to employ a power element instead of external power supply, eliminating the need for external wiring. This simplifies the assembly process, lowers the setup overhead, and eliminates the risk of wire damage.

Another major objective of the present invention is to utilize the combination of MEMS sensor device, power element, and wireless control device to facilitate the interaction between targets and simplify the overall setup process. This leads to an increased variety of shooting modes and enhances the entertainment value and training effectiveness.

To achieve the aforementioned objectives, the electronic target of the present invention includes the following components: a main member having a target base and a front plate, a power element inside the target base, a main control device inside the target base and electrically connected to the power element, a MEMS sensor device behind the front plate and electrically connected to the main control device, and a wireless control device mounted on and electrically connected to the main control device. The wireless control device includes a radio transmitter for transmitting wireless signals and a radio receiver for receiving wireless signals from another electronic target. The wireless signals operate within the frequency range of 868 MHz to 1 GHz.

As the power element directly supplies power to electronic modules like the main control device, the need for external wiring for the electronic target is removed. This simplifies the installation process and removes the limitations on the configuration of the electronic target due to power source location. Additionally, the absence of external wiring prevents damage to the wires caused by stray bullets. Moreover, the adoption of MEMS sensor device as the sensor in the present invention offers the advantages of compact size, lightweight, and low power consumption, which not only facilitates easy setup but also contributes to reducing weight and size, making it more convenient for placement and enhancing overall durability. Furthermore, the use of wireless control device as a communication bridge between electronic targets allows for real-time interaction. When the MEMS sensor device detects that the front plate has been hit and transmits the hit information to the main control device, it can not only output the corresponding reaction control signal based on a preset mode for the hit but also directly send the corresponding action control signal to another electronic target via the radio transmitter. The latter can then receive and execute the corresponding action control signal through its radio receiver, without the need for additional signal transmission through a server, ensuring better real-time performance. Moreover, the wireless control device operates within a frequency range that is distinct from network signals, reducing the susceptibility to interference. The characteristics of this frequency range, such as wide transmission coverage and resistance to signal degradation due to distance or terrain, ensure stable signal delivery and enhance the quality of communication. Coupled with the cost-effectiveness and stable performance of the MEMS sensor device, the electronic target provides more flexibility in setting up shooting modes, minimizing constraints related to cost, distance, location, and venue, thereby offering an improved entertainment experience and training efficiency.

As described, the electronic target of the present invention is able to overcome the drawbacks of conventional electronic targets, such as their inability to reduce weight and size, complicated integration processes, increased manufacturing costs, susceptibility to wire damage, intricate wire arrangements, poor real-time communication between targets, and limitations related to venue and distance. The present invention, therefore, achieves practical advancements that address these issues and provides the mentioned advantages.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

Figure 3:
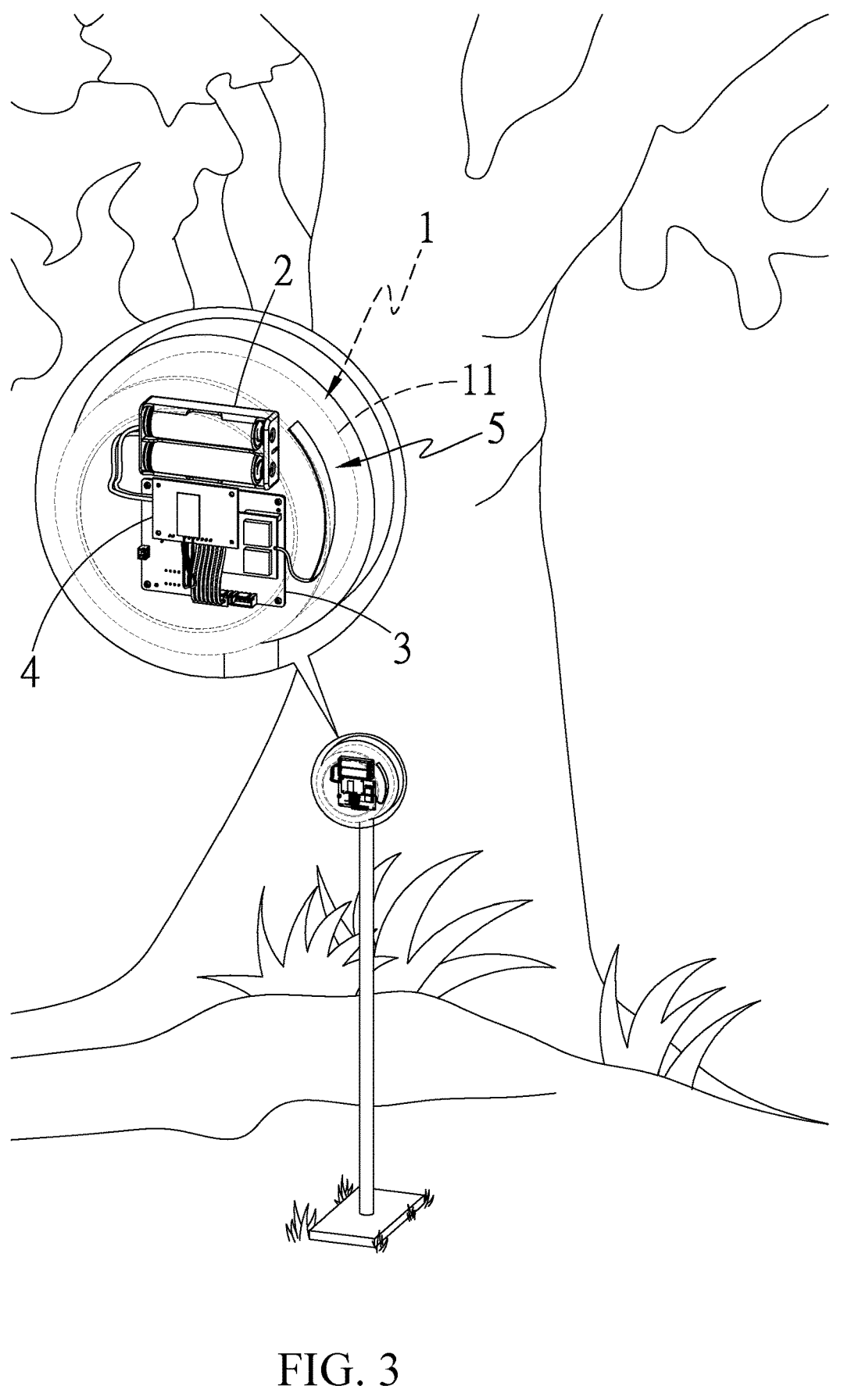

FIG. 3 is a perspective diagram showing a scenario that the electronic target of FIG. 1 is deployed.

DETAILED DESCRIPTION OF THE PREFERRED EMBODIMENTS

Figure 1:
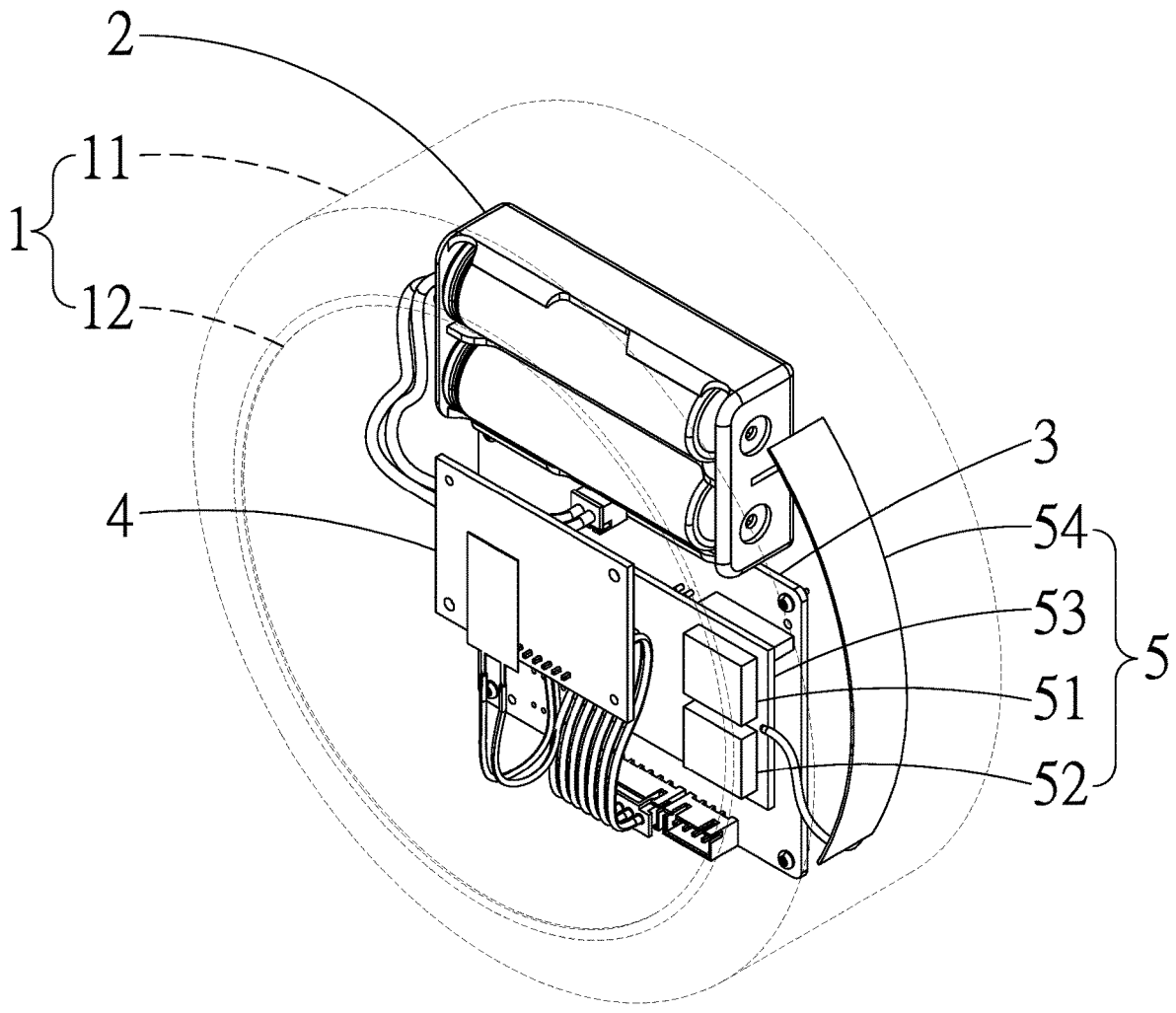
FIG. 1 is a perspective and transparent diagram showing an electronic target according to a first embodiment of the present invention.
Figure 2:
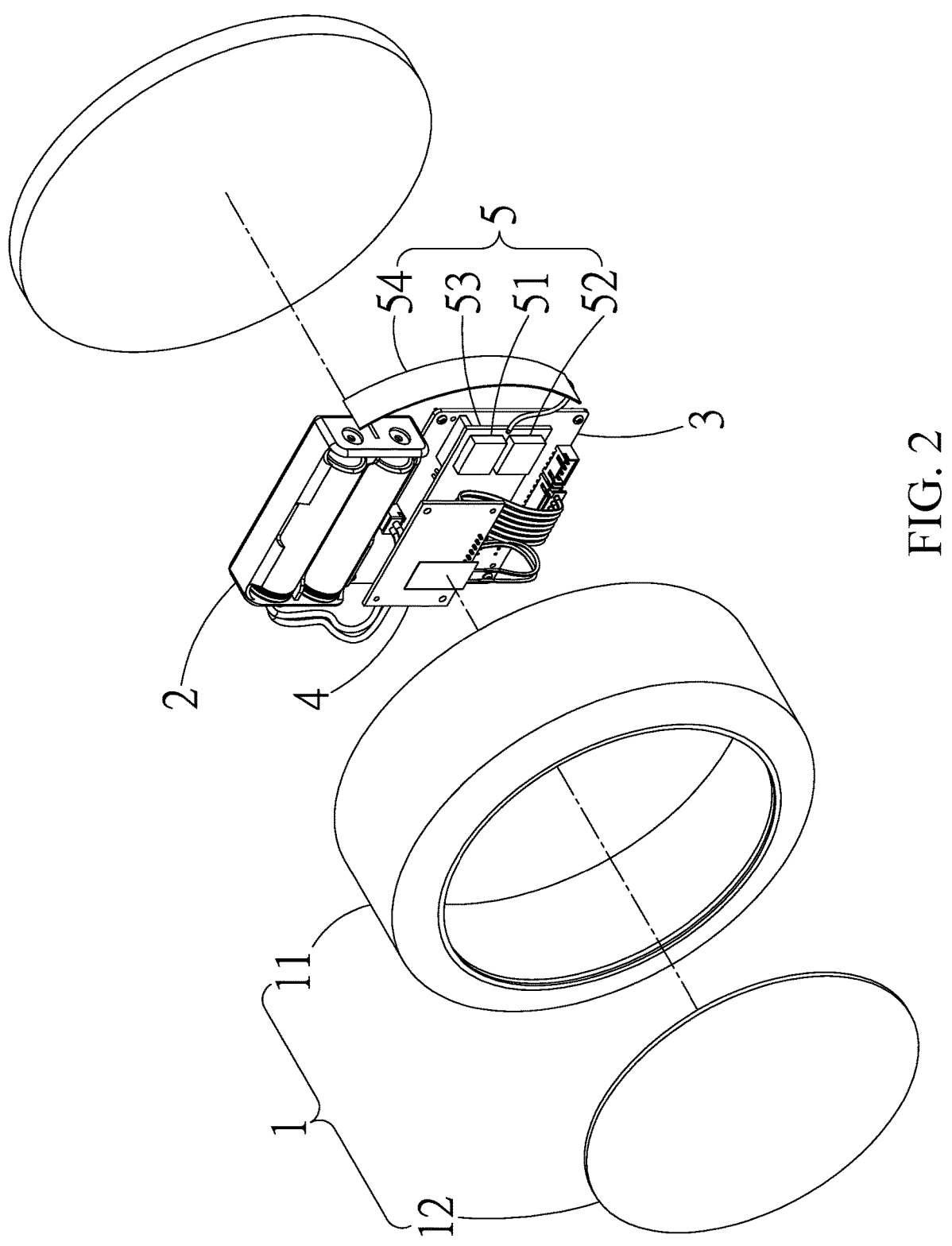
FIG. 2 is a perspective breakdown diagram showing the electronic target of FIG. 1.
Figure 4:
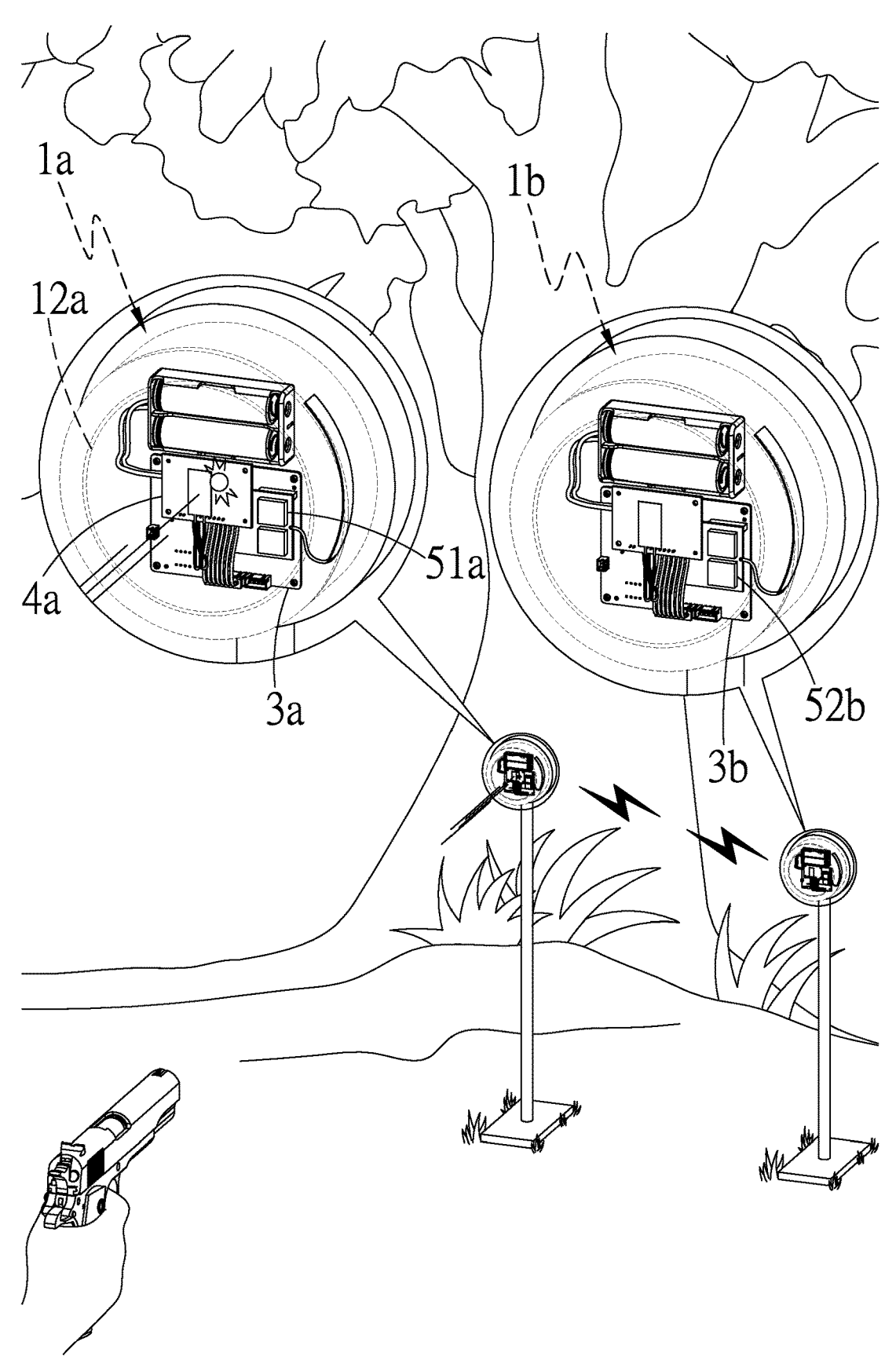
FIG. 4 is a perspective diagram showing a scenario that two electronic targets of FIG. 1 are deployed.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

As shown in FIGS. 1 to 4, an electronic target according to a first embodiment of the present invention includes the following components.

The electronic target includes a main member 1, which is composed of a hollow target base 11 and a front plate 12 joined to a front opening of the target base 11.

The electronic target also includes a power element 2 housed inside the target base 11. In the present embodiment, the power element is a single use battery.

The electronic target further includes a main control device 3 housed inside the target base 11 and electrically connected to the power element 2.

There is a MEMS sensor device 4 configured behind the front plate 12 and electrically connected to the main control device 3. The MEMS sensor device 4 may be a MEMS vibration sensor, MEMS air-pressure sensor, or MEMS light sensor. A MEMS vibration sensor is employed in the present embodiment.

There is also a wireless control device 5 configured on and electrically connected to the main control device 3. The wireless control device 5 includes a radio transmitter 51 for transmitting a radio wave, and a radio receiver 52 for receiving the radio wave from another electronic target. The radio wave has a frequency range between 868 MHz and 1 GHz.

Through the above explanation, it is now possible to understand the structure of the present invention. The electronic target of the present invention offers advantages such as easy assembly, low susceptibility to damage, wide and fast communication range and speed, which facilitates interactions between electronic targets and simplifies the overall setup process. This, in turn, increases the variability of shooting modes and enhances the entertainment or training effectiveness, making it advantageous for configuring target interactions and improving overall user experience. From FIG. 3, it is evident that the power element 2 inside the target base 11 directly supplies power to the main control device 3 and indirectly to the MEMS sensor device 4 and wireless control device 5. This eliminates the need for extended wiring and avoids limitations on its configuration due to power source locations. The setup process becomes simple and easily accessible, particularly beneficial for outdoor settings (such as wilderness or mountainous areas). Moreover, since all the wiring is concealed within the electronic target main member 1, there is no risk of wire damage from stray bullets, thus reducing the likelihood of malfunctions or damages.

Furthermore, the MEMS sensor device 4, as a crucial component of the present invention, utilizes micrometer-scale three-dimensional structure to perform sensing actions or execute functions. The MEMS sensor device 4 possesses both electronic signal processing capabilities and mechanical motion abilities. It can integrate mechanical and electronic components on a same silicon chip, completing hundreds or thousands of mechanical components at once, effectively reducing production costs. The manufacturing technology of MEMS sensor device 4 employs existing semiconductor techniques such as photolithography, etching, and thin-film processes, making it a mature process with enhanced precision. Additionally, the application of optical imaging methods allows the fabrication of tiny and precise mechanical components, effectively reducing size and weight. The MEMS sensor device 4 is more focused on ultra-precision mechanical processing and involves multiple fields, including microelectronics and materials. The signal adjustment of its wave amplifier uses capacitive sensing, offering advantages such as low power consumption, good noise performance, and low temperature coefficient. As a result, it demonstrates excellent performance in power consumption, durability, and stability. Its compact size, light weight, and low power characteristics contribute to reducing weight and size, making it more convenient for arrangement and prolonging the usage time of power element 2. Therefore, when combined with power element 2, MEMS sensor device 4 further enhances the overall durability of the system.

When a user hits the front plate 12a of an electronic target main member 1a, the MEMS sensor device 4a detects the impact and determines that the front plate 12a has been hit. It then generates a hit message, which is transmitted to the main control device 3a. The main control device 3a, based on predetermined settings, generates a response action control signal, which is sent to the impacted electronic target main member 1a. This response action control signal may include information such as the hit time, hit location, cumulative score, etc. Simultaneously, the main control device 3a generates a corresponding action control signal and transmits it to at least another electronic target main member 1b. The transmission of this corresponding action control signal occurs through the electronic target main member 1a's radio transmitter 51a, which sends the signal, and an electronic target main member 1b's radio receiver 52b, which receives the signal. Subsequently, the main control device 3b of the electronic target main member 1b executes the command contained in the corresponding action control signal. In the present embodiment, the usage of the corresponding action control signal is the same as the response action control signal.

Figure 5:
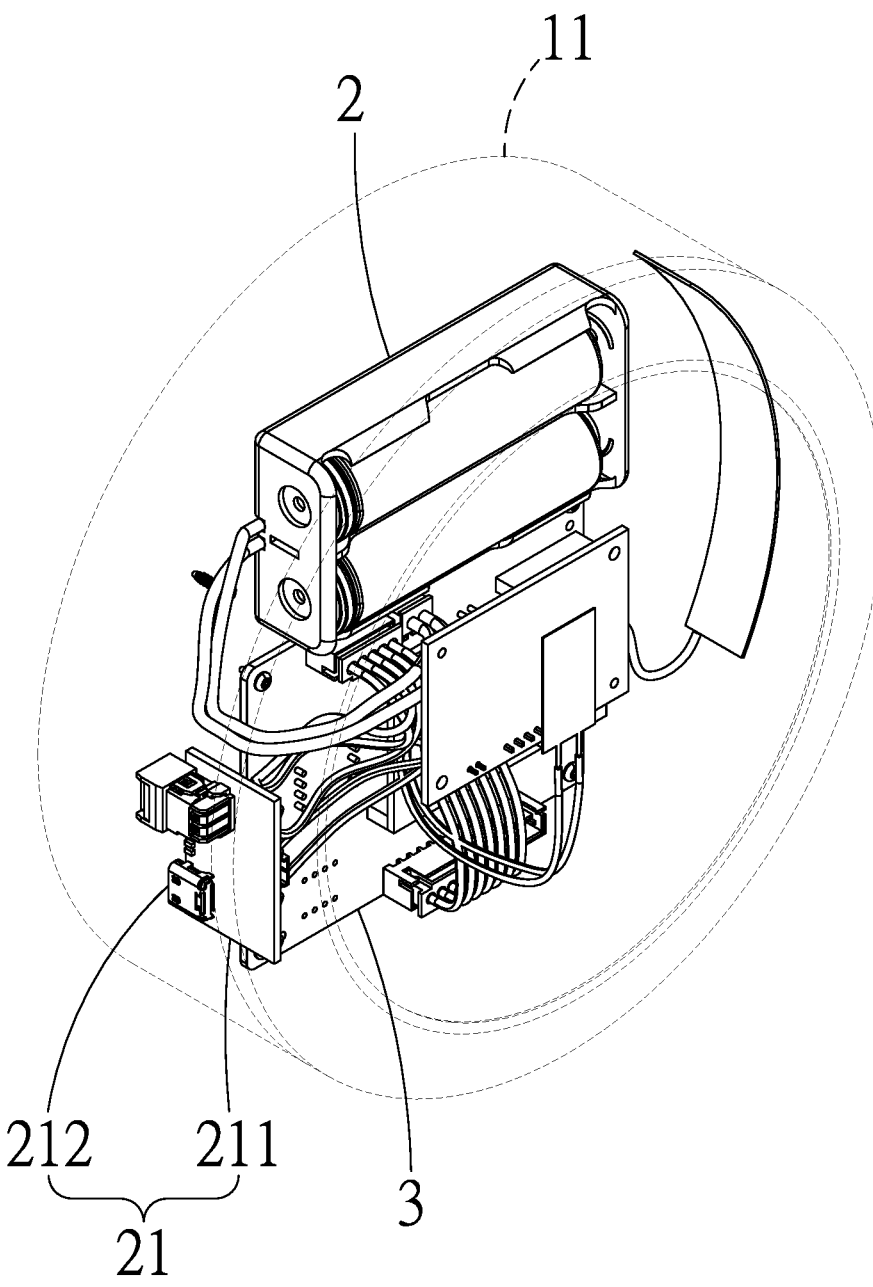
FIG. 5 is a perspective and transparent diagram showing an electronic target according to a second embodiment of the present invention.

The wireless control devices 5 functions as a communication bridge from the electronic target main member 1a to the electronic target main member 1b. The wireless control devices 5 generates radio waves through variations in the strength of current in a conductor. The information is then modulated onto the radio waves for transmission. When the radio waves propagate and reach the receiving end, the changes in the electromagnetic field caused by the radio waves generate current in the conductor. This current variation can be extracted through demodulation techniques to retrieve the transmitted information, achieving the purpose of message delivery. Therefore, the wireless control device 5 includes a circuit board 53 for setting up circuit chips and an antenna 54. The circuit board 53 converts the commands (digital signals) from the main control device 3 into current signals, and the conversion between current signals and radio waves is executed through the radio transmitter 51 and radio receiver 52. Thus, the transmission of the corresponding action control signal is done through electronic target main member 1a's radio transmitter 51a to electronic target main member 1b's radio receiver 52b, without the need for additional signal relay through a server, ensuring better real-time performance. A frequency range for the radio waves is from 868 MHz to 1 GHz (depending on the regulations of each country, either 868 MHz or 915 MHz may be selected). This frequency range is distinct from network signals, making it less susceptible to interference. Additionally, the radio waves in this frequency range have the advantage of a wide transmission range and are not weakened significantly by distance, resulting in more stable signal transmission quality. Together with the low cost and stable performance of MEMS sensor device 4, this allows the variability of shooting mode settings to be less restricted by cost, distance, location, and field conditions, thereby providing better entertainment and training effectiveness. As shown in FIG. 5, an electronic target according to a second embodiment of the present invention differs from the previous embodiment mainly in that, on one side of the main control device 3, there is a charging control module 21, which is electrically connected to the power element 2. In this embodiment, the charging control module 21 includes a charging control board 211 that is coupled to the main control device 3 and a connector socket 212 located on the charging control board 211. Therefore, in this embodiment, the power element 2 can be a rechargeable battery (such as a lithium battery). Users can simply insert a connector plug into the connector socket 212 to charge the power element 2 without the need to disassemble the target base 11. This makes the electronic target more convenient. The charging control board 211 can also provide functions such as voltage conversion and overcharge protection.

Figure 6:
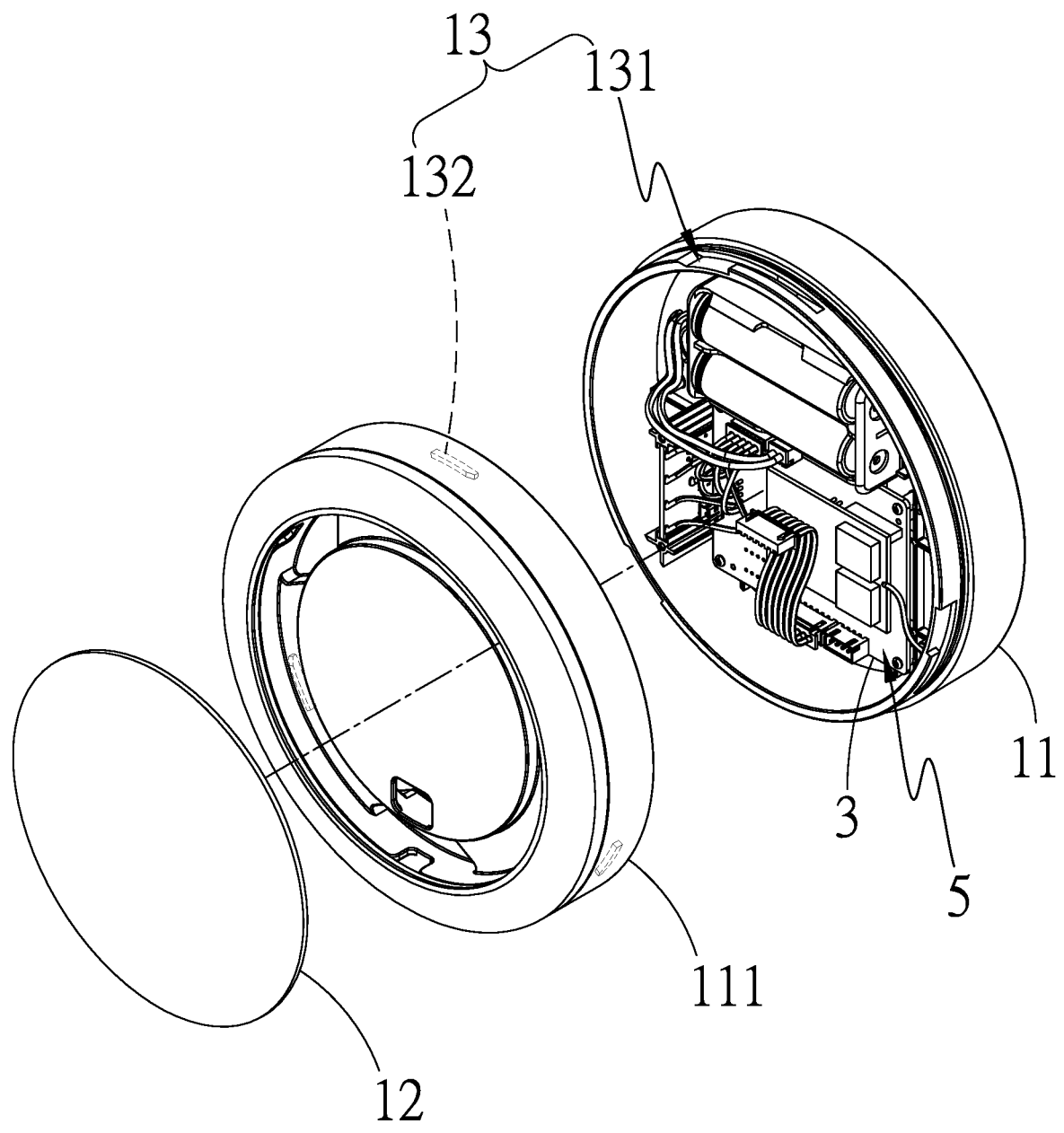
FIG. 6 is a perspective breakdown diagram showing an electronic target according to a third embodiment of the present invention.

As shown in FIG. 6, an electronic target according to a third embodiment of the present invention differs from the previous embodiments mainly in that a detachable cover 111 is mounted to the front opening of the target base 11. The front plate 12 is then attached to the detachable cover 111. The coupling between the target base 11 and the detachable cover 111 is achieved through a fastening assembly 13. The fastening assembly 13 includes L-shaped slots 131 configured around the target base 11's circumference, and ribs 132 configured on an inner wall of the detachable cover 111. To mount the detachable cover 111 to the target base 11, the ribs 132 are aligned with the L-shaped slots 131 and the detachable cover 111 is twisted to secure the coupling between the target base 11 and the detachable cover 111. In this way, the front plate 12 can be conveniently removed to expose the inside of the target base 11 for convenient maintenance.

Figure 7:
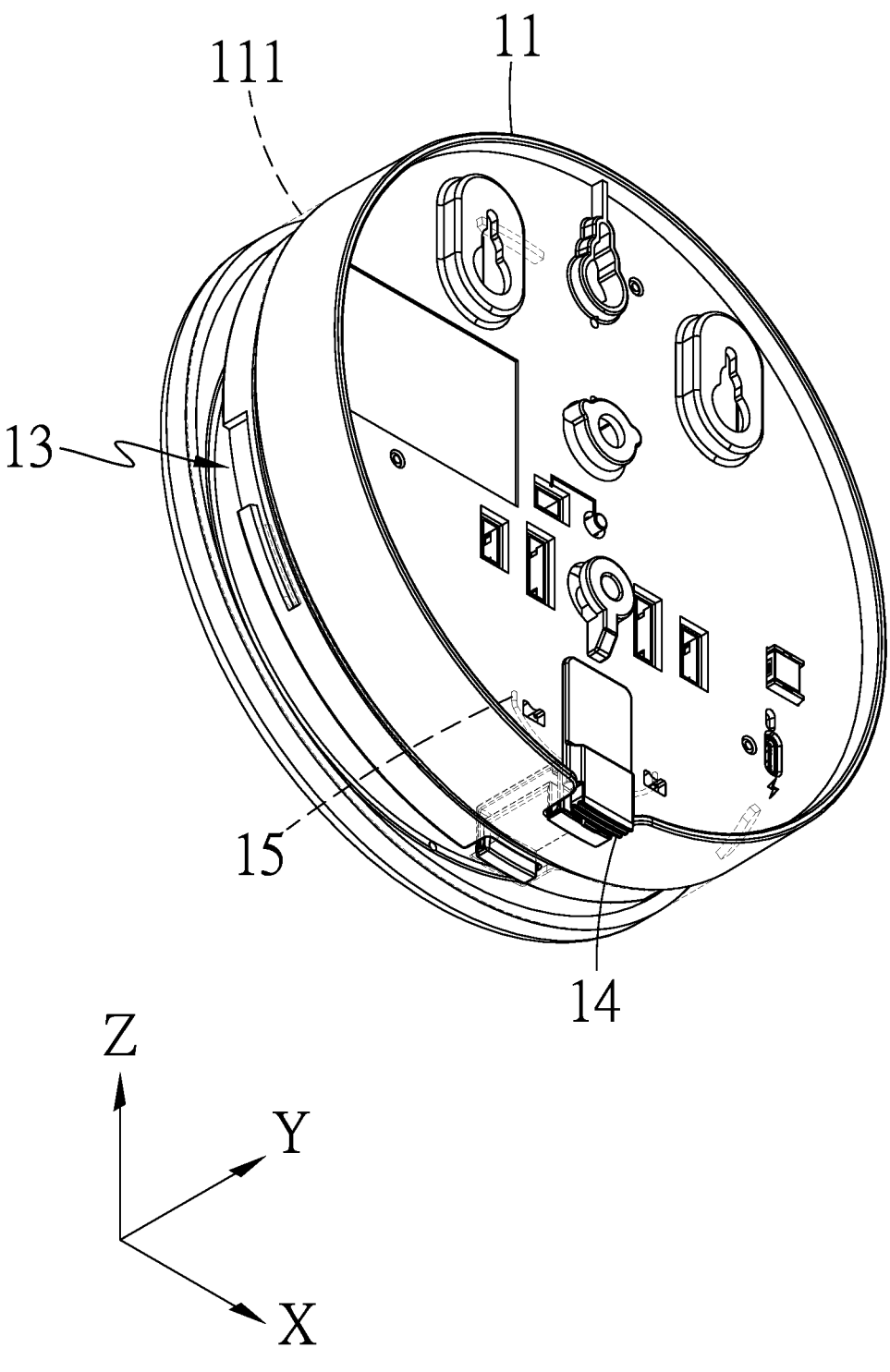
FIG. 7 is a perspective and transparent diagram showing an electronic target according to a fourth embodiment of the present invention.
Figure 8:
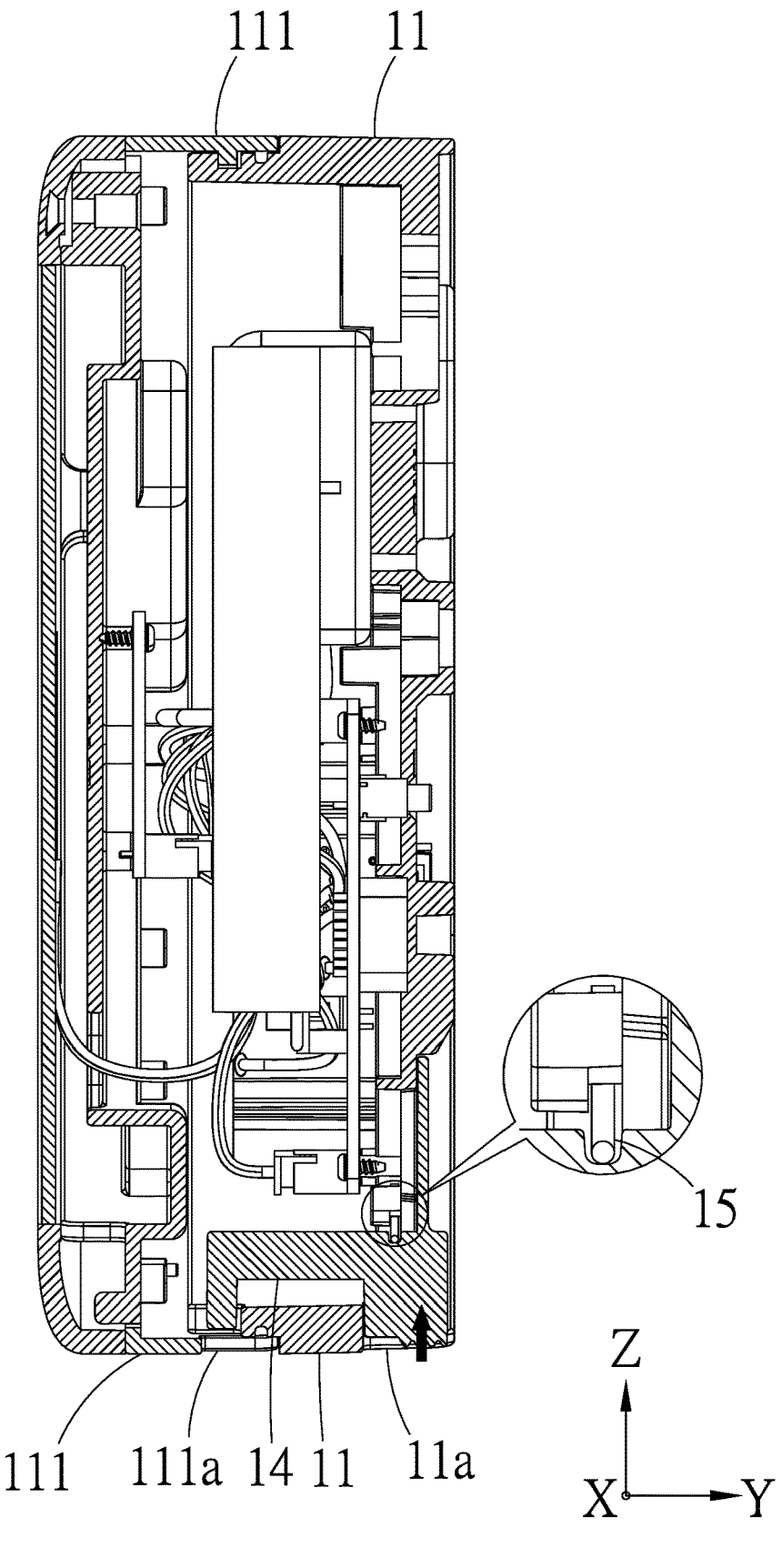
FIG. 8 is a sectional diagram showing the electronic target of FIG. 7.
Figure 9:
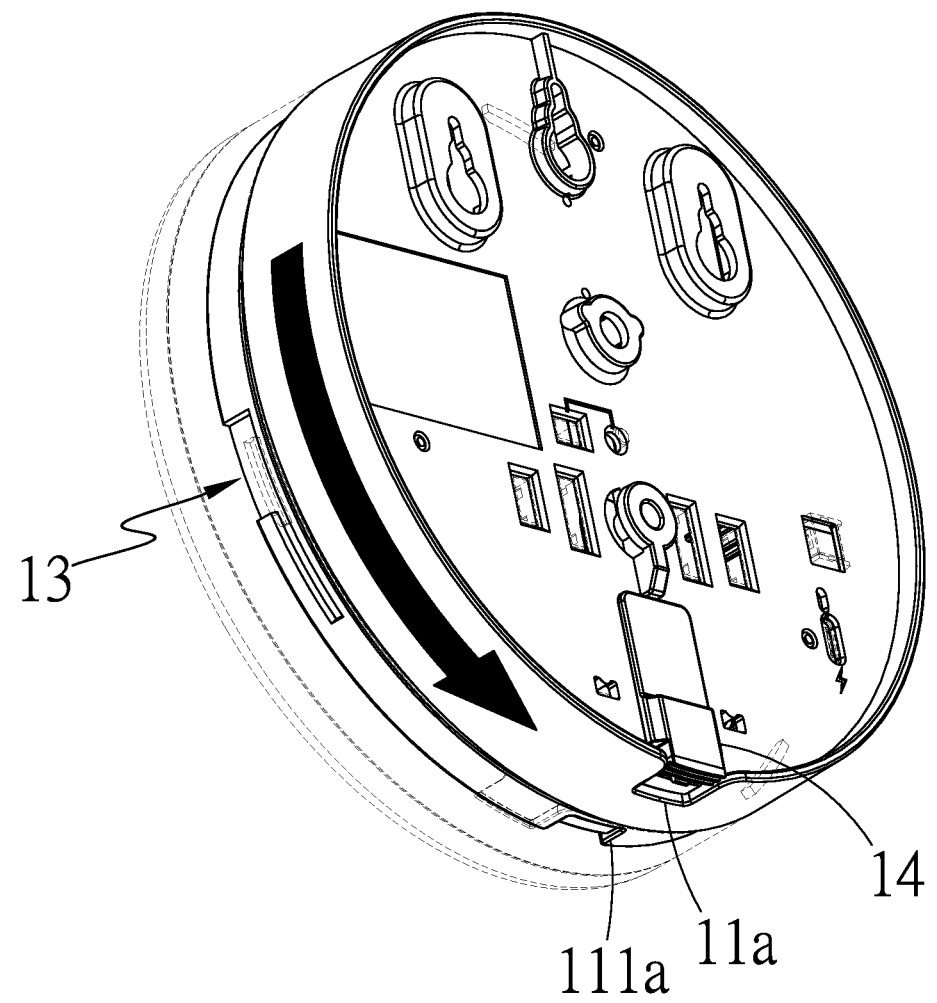
FIG. 9 is a perspective diagram showing the assembly of the electronic target of FIG. 7.

As shown in FIGS. 7 to 9, an electronic target according to a fourth embodiment of the present invention differs from the previous embodiments mainly in that the fastening assembly 13 further includes a latch element 14 and a second elastic element 15 positioned between the target base 11 and the latch element 14. The latch element 14 has a limiting orientation to the target base 11 and the detachable cover 111 different from that achieved through the ribs 132 and the L-shaped slots 131. In this embodiment, the latch element 14 is h-shaped, and its two lower legs are used to securely attach it in a first latch groove 11a of the target base 11 and an adjacent second latch groove 111a on one side of the detachable cover 111. Additionally, the second elastic element 15 applies downward force in the Z direction, preventing the target base 11 and detachable cover 111 from separating in the Y direction. Together with the limiting provided by the fastening assembly 13 along the peripheral side of the target base 11 (in the X-Z plane), the target base 11 and detachable cover 111 are further effectively prevented from coming apart due to vibration.

As shown in FIGS. 8 and 9, to detach the target base 11 and detachable cover 111, the latch element 14 is pressed upward along the Z-axis and inward towards the target base 11. This action simultaneously releases the latch element 14 from securing both the target base 11 and the detachable cover 111. By then rotating the detachable cover 111, the fastening assembly 13 can be released, allowing for easy separation of the detachable cover 111 and the target base 11. However, if the latch element 14 is pressed without rotating the detachable cover 111, once the force applied to the latch element 14 is released, the second elastic element 15 will automatically push back and restore the latch element 14 to its locked position, preventing accidental detaching the detachable cover 111.

Figure 10:
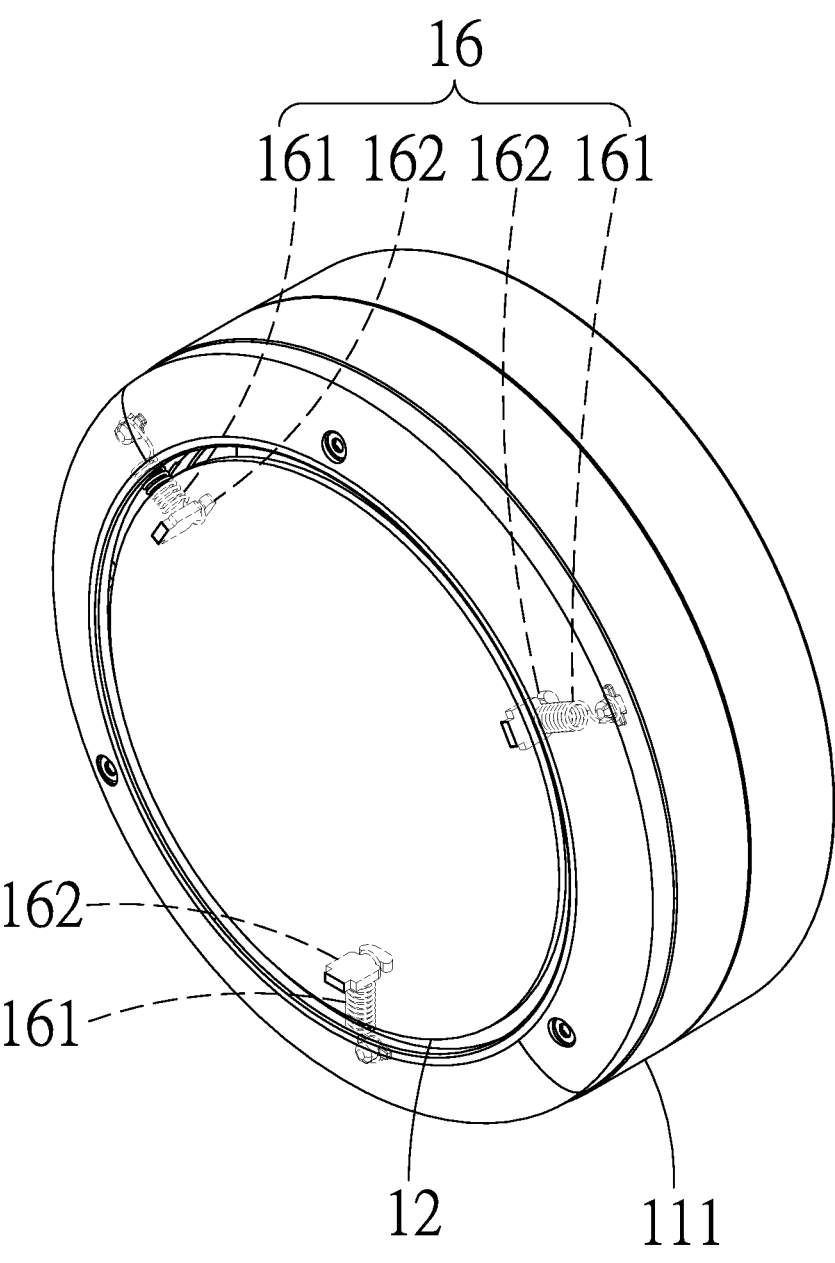
FIG. 10 is a perspective and transparent diagram showing an electronic target according to a fifth embodiment of the present invention.

As shown in FIG. 10, an electronic target according to a fifth embodiment of the present invention differs from the previous embodiments mainly in that, between the front plate 12 and the detachable cover 111, there is a suspended fixation assembly 16, which includes multiple first elastic elements 161 set on the detachable cover 111 and multiple fixation elements 162 connected at both ends to each respective first elastic element 161 and the front plate 12. The first elastic elements 161 are tension springs, with one end fixed to the detachable cover 111 and the other end connected to the fixation elements 162. The fixation elements 162 are structured as plate-like clasps configured around an outer perimeter of the front plate 12. In this embodiment, the suspended fixation assembly 16 consists of three sets of first elastic elements 161 and fixation elements 162 evenly disposed to the front plate 12. The tension generated by each first elastic element 161 results in securing the front plate 12 on the same level as the first elastic elements 161, creating a gap between the front plate 12 and the detachable cover 111, thus achieving a suspended effect. This significantly enhances the vibration sensitivity of the front plate 12, thereby effectively improving the accuracy of the sensing, particularly when combined with the vibration-sensitive MEMS sensor device, resulting in a more precise sensing capability.

Figure 11:
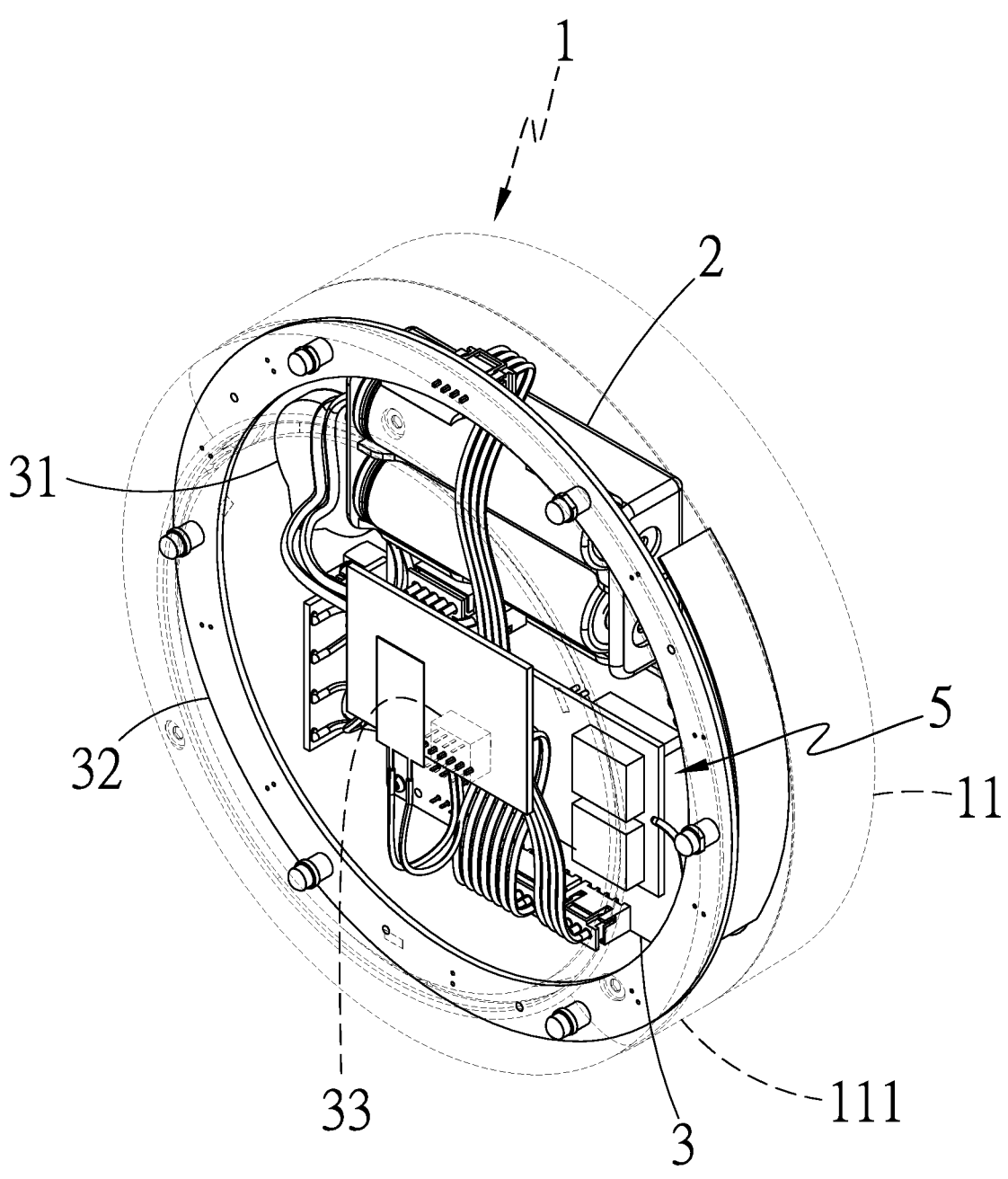
FIG. 11 is a perspective and transparent diagram showing an electronic target according to a sixth embodiment of the present invention.
Figure 12:
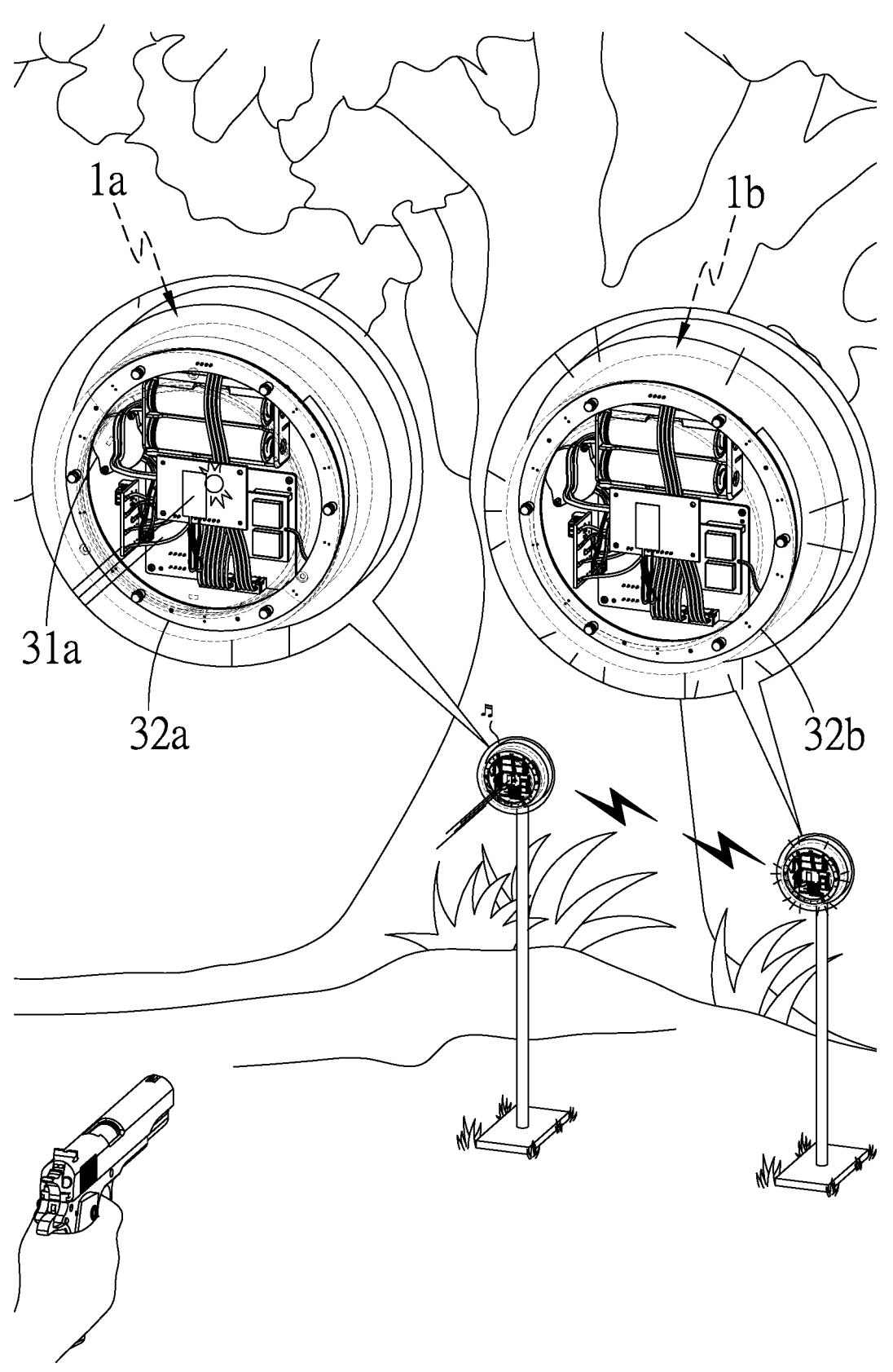
FIG. 12 is a perspective diagram showing a scenario that two electronic targets of FIG. 11 are deployed.

As shown in FIGS. 11 and 12, an electronic target according to a sixth embodiment of the present invention differs from the previous embodiments mainly in that the main control device 3 is equipped with an audible element 31 located inside the target base 11, at least one lighting element 32 positioned on the target base 11, and a mode control module 33 also situated on the target base 11. In the present embodiment, the audible element 31 is a speaker, and the lighting element 32 is a ring-shaped LED light panel. These components are set on the surface of the detachable cover 111 of the target base 11 and covered with a translucent cover. The mode control module 33 may be a DIP switch and is located on the inner side of a bottom plate of the target base 11, with the DIP switch exposed on the bottom of the target base 11. This configuration allows users to manually set the main control device 3 using the DIP switch.

Due to the employment of the power element 2 and wireless control device 5, the present invention reduces the setup overhead for the electronic target main member 1, making it easy to deploy in various remote areas or locations with weak network signals (such as wilderness or mountainous regions). By using the wireless control device 5, electronic target main members 1 can directly and quickly interact with each other without the need for server relay. For instance, one can set the lighting element 32a of electronic target main member 1a to illuminate, indicating it as the current target for the user to shoot. Once hit, in addition to sounding the audible element 31a to signal a successful hit, the lighting element 32a of the hit target turns off. The wireless control device 5 then transmits a corresponding action control signal to electronic target main member 1b, causing its lighting element 32b to illuminate, guiding the user to target it as the next shooting objective. Furthermore, in gaming modes, one can set electronic target main member 1a to require multiple hits before revealing the next shooting target. This approach allows the present invention to offer a high degree of freedom in designing various entertainment or training modes, without imposing significant design constraints or complex setup procedures.

Figure 13:
FIG. 13 is a perspective and transparent diagram showing an electronic target according to a seventh embodiment of the present invention.

As shown in FIG. 13, an electronic target according to a seventh embodiment of the present invention differs from the previous embodiments mainly in that the wireless control device 5 is equipped with an application interface module 55 that allows information linking with a mobile electronic device 6 to facilitate interaction with the main control device 3. This integration enables a mobile application on the mobile electronic device 6 to control the activation/deactivation of the electronic target main member 1, display which target has been hit, receive error messages, and other configurations. If the information link of the application interface module 55 is achieved through network signal, a user can set up multiple electronic target main members 1 by directly configuring one main member 1 while its wireless control device 5 to apply the settings to other electronic target main members 1. Alternatively, the application interface module 55 can also allow the user to directly configure each electronic target main member 1 individually. In other words, there are no limitations on the method of connection between the electronic target main member 1 and the mobile electronic device 6.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. An electronic target, comprising:
   a main member having a target base and a front plate joined to a front opening of the target base;
   a power element inside the target base;
   a main control device inside the target base and electrically connected to the power element;
   a MEMS (Micro Electro Mechanical Systems) sensor device behind the front plate and electrically connected to the main control device; and
   a wireless control device mounted on and electrically connected to the main control device, where the wireless control device comprises a radio transmitter for transmitting wireless signals and a radio receiver for receiving wireless signals from another electronic target, and the wireless signals operate within a frequency range of 868 MHz to 1 GHz.

2. The electronic target according to claim 1, further comprising a charging control module on one side of the main control device electrically connected to the power element.

3. The electronic target according to claim 1, wherein the main control device comprises a mode control module situated on the target base.

4. The electronic target according to claim 1, wherein the main control device comprises an audible element inside the target base.

5. The electronic target according to claim 1, wherein the main control device comprises at least one lighting element situated on the target base.

6. The electronic target according to claim 1, further comprising a detachable cover coupled to the front opening of the target base, where the front plate is attached to the detachable cover.

7. The electronic target according to claim 6, wherein the front plate is attached to the detachable cover by a suspended fixation assembly; and the suspended fixation assembly comprises a plurality of first elastic elements set on the detachable cover and a plurality of fixation elements connected at both ends to each respective first elastic element and the front plate.

8. The electronic target according to claim 6, wherein the detachable cover is coupled to the target base by a fastening assembly.

9. The electronic target according to claim 8, wherein the fastening assembly comprises a latch element and a second elastic element positioned between the target base and the latch element; and the latch element has a limiting orientation to the target base and the detachable cover different from that achieved by the fastening assembly.

10. The electronic target according to claim 1, wherein the wireless control device comprises an application interface module.

* * * * *